United States Patent [19]
Kikinis

[11] Patent Number: 5,099,301
[45] Date of Patent: Mar. 24, 1992

[54] ELECTROLUMINESCENT SEMICONDUCTOR DEVICE

[75] Inventor: Dan Kikinis, Cupertino, Calif.

[73] Assignee: Yu Holding (BVI), Inc., Tortola, British Virgin Isls.

[21] Appl. No.: 414,670

[22] Filed: Sep. 29, 1989

[51] Int. Cl.$^5$ ............................................. H01L 27/02
[52] U.S. Cl. ..................................... 357/41; 313/505; 357/40; 372/50
[58] Field of Search ....................... 340/781, 718, 719; 313/500, 505, 498; 357/41, 40; 372/50

[56] References Cited

U.S. PATENT DOCUMENTS

| | | | |
|---|---|---|---|
| 4,523,189 | 6/1985 | Takahara et al. | 340/781 |
| 4,665,342 | 5/1987 | Topp et al. | 313/505 |
| 4,935,665 | 6/1990 | Murata | 313/500 |

Primary Examiner—James W. Davie
Attorney, Agent, or Firm—Thomas E. Schatzel

[57] ABSTRACT

An electroluminescent semiconductor device in which the drain of a MOSFET acts as the driver for a manganese doped zinc sulfide electroluminescent layer. The zinc sulfide layer is coated with a layer of metal which prevents the emission of light from the electroluminescent layer except through an aperture extending through the metal layer. Alternatively, the aperture is omitted and laser emission is induced from a semi-reflective end plate positioned on a side of the electroluminescent layer.

10 Claims, 1 Drawing Sheet

U.S. Patent     Mar. 24, 1992     5,099,301
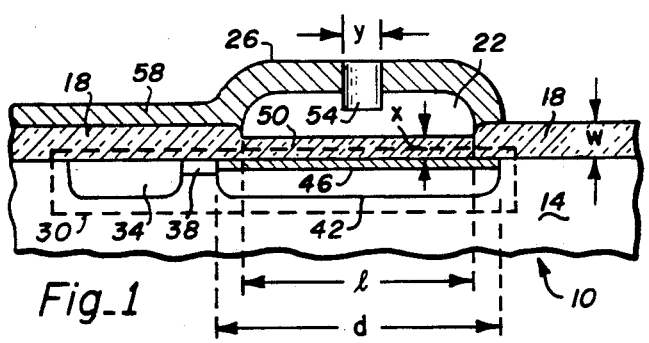
Fig_1
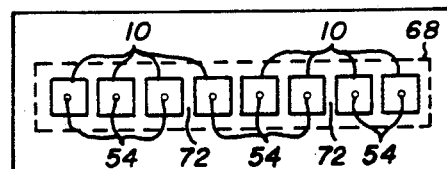
Fig.3
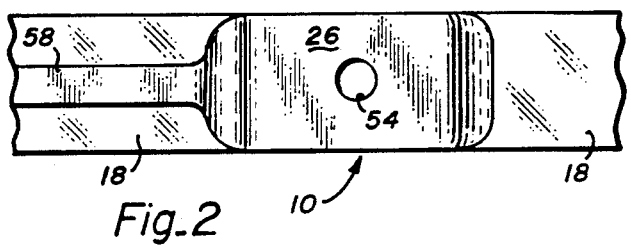
Fig_2
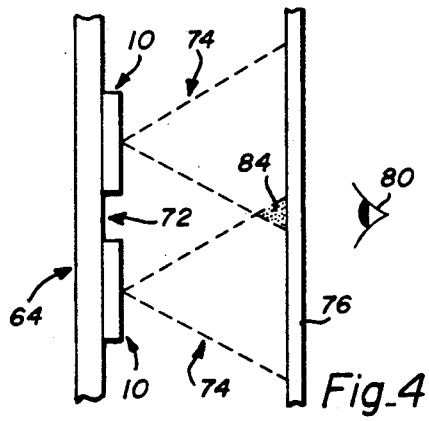
Fig_4
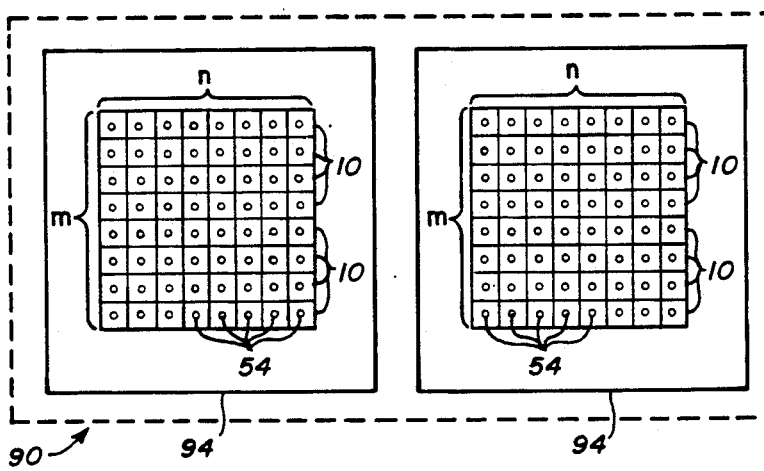
Fig_5
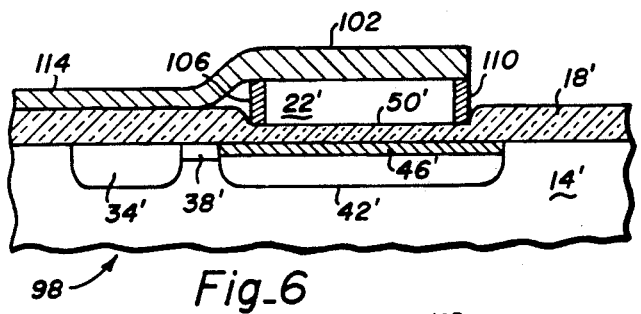
Fig_6
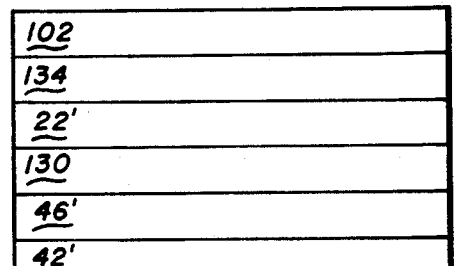
Fig_8
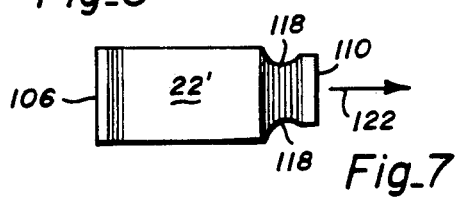
Fig_7

ELECTROLUMINESCENT SEMICONDUCTOR DEVICE

BACKGROUND OF THE INVENTION

1. Field of the Invention

The present invention relates to a semiconductor device and more particularly to an integrated circuit having a zinc sulfide electroluminescent layer grown directly on a silicon based control circuit.

2. Description of the Prior Art

The use of electroluminescent (EL) display elements with thin film transistor control circuitry is known technology. For example, U.S. Pat. No. 4,042,854, issued to Luo, et al. on Aug. 16, 1977, discloses a thin film transistor array and an electroluminescent phosphor layer disposed between a pair of elongated electrodes for exciting the phosphor layer. Similarly, U.S. Pat. No. 4,110,664, issued to Asars, et al. on Aug. 29, 1978, discloses an electroluminescent bar graph display module comprised of a multistage thin film transistor and plurality of electroluminescent display elements.

U.S. Pat. No. 4,523,189, issued to Takahara, et al. on June 11, 1985, discloses a thin film EL device comprising a zinc sulfide/manganese phosphor layer sandwiched between electrode layers and positioned on top of a plurality of N-channel MOS transistors.

It is also known technology to utilize a liquid crystal display (LCD) with a thin film semiconductor device. For example, U.S. Pat. No. 4,486,748, issued to Nanomura, et al. on Dec. 4, 1984, discloses an LCD layer driven by a thin film transistor array and an electrode. U.S. Pat. Nos. 4,644,338 and 4,740,782, issued to Aoki, et al. on Feb. 17, 1987 and Apr. 26, 1988, respectively, disclose a dot matrix LCD driven by a plurality of thin film transistors and requiring a reduced number of terminals for external connection.

The construction of semiconductor devices having other types of light sources is also known technology. U.S. Pat. No. 4,608,696, issued to Law, et al. on Aug. 26, 1986, discloses semiconductor laser and a metal-insulator-semiconductor field effect transistor (MISFET) built as a monolithic device using planar fabrication techniques. U.S. Pat. No. 4,719,498, issued to Wada, et al. on Jan. 12, 1988, discloses an optoelectric integrated circuit in which the optical element, e.g., a laser diode, and the electronic semiconductor elements are formed nearly flatly on a single substrate.

All of the semiconductor devices disclosed in this list of prior art require a plurality of electrodes and nonactive conductive parts or layers within the semiconductor device in order to activate the electroluminescent element.

H. S. Reehal and C. B. Thomas, in a paper published in *Solid-State Electronics* (GB), Vol. 29, No. 4, pp. 429-36 (April 1986), disclose the use of a zinc sulfide electroluminescent layer positioned directly on a silicon substrate without the use of intervening conductive parts. However, the silicon substrate does not include control circuit elements for driving the electroluminescent layer.

SUMMARY OF THE PRESENT INVENTION

It is therefore an object of the present invention to provide an electroluminescent semiconductor device that requires fewer internal electrical connections than the prior art.

It is another object of the present invention to provide an electroluminescent semiconductor device that is capable of use as a linear light dot device.

It is another object of the present invention to provide an electroluminescent semiconductor device that is capable of use as a planar light dot device.

It is another object of the present invention to provide an electroluminescent semiconductor device capable of use in a high resolution optical display.

It is another object of the present invention to provide an electroluminescent semiconductor device that is efficient and does not flicker.

It is another object of the present invention to provide an electroluminescent semiconductor device that operates at low voltages.

Briefly, a preferred embodiment of the present invention comprises an electroluminescent (EL) semiconductor device comprised of a conventional integrated circuit, e.g. a metal-oxide-semiconductor field-effect transistor (MOSFET) or a bipolar transistor etc., formed on a surface of a silicon or other semiconductor substrate. An insulating layer, e.g. silicon dioxide, is formed over the integrated circuit with a recessed region of the insulating layer being positioned over the electron emitting element of the integrated circuit, e.g. the drain of the MOSFET. A thin dopant layer is grown on the recessed region and a zinc sulfide (ZnS) electroluminescent layer is formed on top of the dopant layer. The dopant layer increases the quantum efficiency of light emission from the EL layer and reduces the required operational voltage of the EL device.

An advantage of using ZnS as the EL layer in place of gallium arsenide (GaAs) is that ZnS is much less toxic during the process handling steps than GaAs and thus simplifies the manufacturing process. The ZnS layer is doped with an impurity or combination of impurities such as manganese and/or oxygen, hydrogen, nitrogen etc., to tailor the optical properties of the light emission depending on the application of the EL device. A metal layer is formed over the ZnS layer and an aperture is etched through the metal layer into the ZnS layer.

In operation, the electron emitting element, e.g. the drain of the MOSFET, acts as an optical driver for the ZnS layer causing light emission from the ZnS layer. Only emission occuring through the aperture is detectable and this emission is an intense, nonflickering emission. The shape of the aperture can be used to alter the optical nature of the emission. By omitting the aperture, light emission can be directed from the sides of the EL layer, thus forming a lateral laser device. Since the size of the aperture can be on the order of one micron in diameter, a dot matrix array having 4000-6000 dots per inch can be constructed using a plurality of the electroluminescent semiconductor devices. The dot matrix array can be used in either a linear or a planar light dot device. Such a device could be used as a laser printer or as a high resolution display.

Resolutions of one micron or less are possible with the present invention because features, such as the aperture, are etched into the ZnS surface using conventional semiconductor manufacturing lithographic techniques. Furthermore, because the EL layer is positioned directly on the integrated circuit control surface, there are no leads or electrodes required between the integrated circuit and the EL display. This greatly reduces the number of required electrical connections and makes a high resolution display possible.

An advantage of the present invention is that no electronic connections are required between the electroluminous display and the display driver circuit.

Another advantage of the present invention is that the configuration of the electroluminous device is well-suited for use in a linear or planar light dot device.

Another advantage of the present invention is that the approximately one micron resolution of the electroluminous device permits its use in a high resolution optical display.

Another advantage of the present invention is that the light emission from the ZnS layer is steady and very efficient.

Another advantage of the present invention is that the use of a dopant layer permits the electroluminous device to operate at low voltages.

These and other objects and advantages of the present invention will no doubt become obvious to those of ordinary skill in the art after having read the following detailed description of the preferred embodiment(s) which are illustrated in the various drawing figures.

IN THE DRAWING

FIG. 1 illustrates a cross-sectional view of an electroluminescent device according to the present invention;

FIG. 2 illustrates a top view of the electroluminescent device of FIG. 1;

FIG. 3 illustrates a top view of a linear light dot device according to the present invention;

FIG. 4 illustrates a partial side view of the linear light dot device of FIG. 3;

FIG. 5 illustrates a top view of a planar light dot device according to the present invention;

FIG. 6 illustrates a cross-sectional view of lateral laser device according to the present invention;

FIG. 7 illustrates a partial top view of the lateral laser device of FIG. 6; and FIG. 8 illustrates a multi-layer configuration for use with the lateral laser device of FIG. 6.

DETAILED DESCRIPTION OF THE PREFERRED EMBODIMENT

FIG. 1 illustrates a cross-sectional view of an electroluminescent semiconductor device 10 which comprises a semiconductor substrate layer 14, an insulator layer 18, an electroluminescent (EL) layer 22 and a metal layer 26. An integrated control circuit 30, which could be any type of integrated circuit having a controllable electron emitting element, is formed on the semiconductor substrate layer 14. In the preferred embodiment the integrated circuit 30 comprises a MOSFET. The MOSFET comprises a source 34, a gate 38 and a drain 42, formed in the silicon substrate layer 14. A dopant layer 46 is formed over the drain 42 between the oxide layer 18 and the drain 42 and extends along the entire length "d" of the drain 42.

The oxide layer 18 has a width "w" and includes a recessed region 50 having a width "x" that is less than the width "w". The width "x" could be zero, i.e. the EL layer 22 would be in direct contact with the dopant layer 46. The shape of the recessed region 50 can vary. In the preferred embodiment, a circular or square shape is preferred. The recessed region 50 has a length "l" which is typically smaller than the length "d" but which could be greater than "d".

The EL layer 22 is positioned in the recessed region 50 between the metal layer 26 and the recessed region 50. An aperture 54 having a width "y", extends through the metal layer 26 and into the EL layer 22. Typically, "y" is in the range of 1 to 50 microns. However, "y" can be constructed to be less than one micron by using, for example, a gas plasma etching technique to yield a submicron aperture. In the preferred embodiment, the metal layer 26 encloses the EL layer 22 except at the aperture 54. A power connecting conductor 58, which is an elongated part of the metal layer 26, provides a means for making electrical connection such as to a voltage source.

In an embodiment, the semiconductor substrate layer 14 comprises p+ silicon and the insulator layer 18 comprises silicon dioxide. Other semiconductor materials such as gallium arsenide could be used as the substrate layer 14 and other insulating materials such as zinc oxide, silicon nitride or ceramic or glass-like materials could be used as the insulator layer 18. In an embodiment the EL layer 22 comprises zinc sulfide (ZnS) and has a thickness of approximately 50-3000 Angstroms. The metal layer 26 comprises a metal with gold deposition type properties, such as aluminum, gold or chromium, and has a thickness used in conventional integrated circuit manufacturing processes.

The dopant layer 46 may comprise any of a number of dopants. In an embodiment, the dopant layer 46 comprises a n++ dopant such as phosphorous or arsenic and has a thickness of approximately 100 Angstroms and a density of approximately $1 \times 10^{18}$ dopant atoms/cm$^3$. With an n++ dopant layer 46, the drain 42 would comprise p− silicon. If a p− dopant layer 46 is utilized, the drain 42 would comprise n++ silicon.

The source 34, gate 38 and drain 42 are comprised of materials common in CMOS technology. For example, the gate 38 may comprise polysilicon doped with phosphorous and the source 34 and drain 42 comprise p− or n++ silicon as explained previously. The EL layer 22 is doped with an impurity such as manganese, terbium, selenium, oxygen hydrogen, nitrogen or a rare earth element, selected to meet the desired optical properties of the electroluminescent device 10.

A process for manufacturing the electroluminescent device 10 can be summarized as follows for a silicon based device:

1. The integrated control circuit 28 is formed on a silicon wafer using conventional silicon manufacturing techniques such as CMOS technology. The dopant layer 46 is grown on top of the drain 42, using thin film methods as described below. The dopant layer 46 is then annealed, using conventional techniques, causing diffusion of the dopant into the silicon of the drain 42 and resulting in a thickness for the dopant layer 46 of approximately 100 Angstroms;

2. Grow the ZnS EL layer 22 using thin-film methods such as metal organic chemical vapor deposition (MOCVD), molecular beam epitaxy (MBE) or radio frequency (RF) sputtering, etc.;

3. Alternatively, thick film methods can be used to grow the EL layer 22. For example, ZnS particles are milled to approximately 500 to 1000 Angstrom particle size and dissolved in photoresist. The solution is then applied to the semiconductor substrate 14 using spin coating techniques and the photoresist is developed to yield the desired shape of the ZnS layer;

4. Use conventional metalization techniques to form the metal layer 26 and power connecting conductor 58; and 5. Etch the aperture 54 through the metal layer 26 and into the EL layer 22.

The functioning of the electroluminescent device 10 is believed to be as follows. Electrons collect in the drain 42 in the region where the dopant layer 46 has diffused. When the voltage across the junction between the EL layer 22 and the drain 42 is sufficiently high, these electrons jump into the EL layer 22 and activate the dopant centers, e.g. Mn in the preferred embodiment. Light is emitted when the electrons drop down from the conduction band of the dopant (Mn) center to a nonexcited state. Electrons then flow away from the EL layer 22 via the metal layer 26 and the power connecting conductor 58. The electroluminescent device 10 can operate with small currents because the dopant layer 46 functions to inject only "hot" electrons into the EL layer 22. If the EL layer 22 is formed with a thin film technique, the EL device 10 can be operated at voltages in the range of two to twenty volts. If a thick film technique is used, operating voltages in the range of ten to one hundred volts are required.

FIG. 2 is a top view of the EL semiconductor device 10 showing the aperture 54 as being circular in shape.

FIG. 3 shows a top view of a linear light dot device 64. A plurality of the EL semiconductor devices 10 arranged in a row 68. A space 72 exists between each adjacent pair of the EL semiconductor devices 10.

FIG. 4 shows a side view of the linear light dot device 64. A beam of light 74 emitted from the EL devices 10 is projected on a lens system 76, such as a Fresnel lens. An observer 80 sees the light emitted from the individual EL devices 10 as a solid line of light because the lens system 76 causes the individual beams 74 to be focused in the overlap area 84. Without the lens system 76, the spaces 72 would cause spaces to exist between the beams of light 74. The linear light dot device 64 could be used, for example, as a light-source element (light bar) for a xerographic type printing/display system, for a precision measurement system or for medical applications like eye surgery.

FIG. 5 shows a top view of a planar light dot device 90 comprised of a pair of planar display units 94. Each of the planar display units 94 comprise a plurality of EL devices 10 arranged in an m×n array. Because emission of light from each of the individual EL devices 10 within the planar light dot device 10 is controlled by a separate integrated control circuit 28, each of the EL devices can be independently controlled. The planar light dot device is suitable for use, for example, as a miniature high-resolution screen or as a subassembly for a large display shape recognition system.

FIG. 6 shows an alternative embodiment of the EL semiconductor device 10 referred to as an electroluminescent lateral laser device 98. Elements of the lateral laser device 98 that are identical to elements in the EL device 10 are referred to by the same numeral followed by a prime symbol.

In the lateral laser device 98, the electroluminescent layer 22' is enclosed by a metal layer 102. A reflective end plate 106 and a semi-reflective end plate 110 form two sides of the metal layer 22'. In the preferred embodiment, the reflective and semi-reflective end plates 106 and 110, comprise a metal/metal-carbide material. The metal layer 102 is electronically analogous to the metal layer 26 and includes an elongated power connecting conductor 114 which functions analogously to the power connecting conductor 58.

FIG. 7 shows a partial top view of the lateral laser device 98. A pair of light concentrating notches 118, which are indented regions in the EL layer 22, are formed in the EL layer 22' adjacent to the semi-reflective end plate 110. In operation, light emission from the EL layer 22' is reflected back and forth between the end plates 106 and 110 until it possesses sufficient energy to pass through the semi-reflective end plate 110 in the lateral direction indicated by an arrow 118. Emission from any other part of the metal layer 102 is not possible. The light concentrating notches 118 intensify the light approaching the end plate 110.

A linear array of the laser devices 98, analogous to the linear light dot device 64 shown in FIG. 3, can be constructed by positioning a plurality of the laser devices 98 in a row.

FIG. 8 illustrates a multi-layer configuration 126 of the EL layer 22' for use in the lateral laser device 98. In the multi-layer configuration 126, a first dielectric layer 130 is disposed between the EL layer 22' and the dopant layer 46'. A second dielectric layer 134 is disposed between the EL layer 22' and the metal layer 102. The dielectric layers 130 and 134 function to increase the energy of the electrons passing from the dopant layer 46' into the EL layer 22''. This increases the quantum efficiency of emission from the lateral laser device 98, but also increases the operating voltage of the lateral laser device 98. Therefore, the thickness of the dielectric layers 130 and 134 needs to be selected so that the conduction band of the layers 130 and 134 is less than the breakdown voltage of the multi-layer configuration 126.

The first dielectric layer 130 and the second dielectric layer 134 could comprise a material such as silicon dioxide or silicon nitride as used in standard CMOS or BiMOS processes.

Although the present invention has been described in terms of the presently preferred embodiment(s), it is to be understood that such disclosure is not to be interpreted as limiting. Various alterations and modifications will no doubt become apparent to those skilled in the art after having read the above disclosure. Accordingly, it is intended that the appended claims be interpreted as covering all alterations and modifications as fall within the true spirit and scope of the invention.

I claim:
1. An electroluminous device comprising:
   a semiconductor substrate including at least one integrated circuit element for generating a controlled supply of electrons and positioned on a surface of the semiconductor substrate;
   an electroluminescent layer deposited over and integrated into said integrated circuit element such that said electroluminescent layer is in direct physical contact with at least one terminal of said integrated circuit element, for generating light in response to a flow of electrons from said integrated circuit element to the electroluminescent layer; and
   an electrically conductive non-transparent layer covering at least part of the electroluminescent layer.
2. An electroluminous device, comprising:
   a semiconductor substrate including at least one integrated circuit element for generating a controlled supply of electrons and positioned on a surface of the semiconductor substrate;
   an electroluminescent layer deposited over said integrated circuit element, for generating light in response to a flow of electrons from said integrated circuit element to the electroluminescent layer;
   an electrically conductive non-transparent layer covering at least part of the electroluminescent layer;

said integrated circuit element comprising a MOS-
FET having a source element, a gate element and a
drain element; and a dopant layer coated on a surface of said drain element and positioned between said drain element and the electroluminescent layer.

3. The electroluminous device of claim 2 wherein,
the electroluminescent layer comprises zinc sulfide (ZnS).

4. The electroluminous device of claim 2 wherein,
the electroluminescent layer comprises zinc sulfide and magnanese.

5. The electroluminous device of claim 2 wherein,
the electrically conductive layer comprises a metal.

6. The electroluminous device of claim 2 wherein,
the light generated by the electroluminescent layer is emitted through an aperture in the electrically conductive layer.

7. The electroluminous device of claim 6 wherein,
said aperture has a diameter in the range of 1 to 50 microns.

8. An electroluminous light dot device comprising:
a plurality of electroluminous devices arranged in at least one linear row and each of the electroluminous devices comprising, a semiconductor substrate including at least one integrated circuit element for generating a controlled supply of electrons and positioned on a surface of the semiconductor substrate;

an electroluminescent layer deposited over said integrated circuit element, for generating light in response to a flow of electrons from said integrated circuit element to the electroluminescent layer;

an electrically conductive non-transparent layer covering at least part of the electroluminescent layer;

said integrated circuit element comprising a MOS-FET having a source element, a gate element and a drain element; and a dopant layer coated on a surface of said drain element and positioned between said drain element and the electroluminescent layer.

9. The electroluminous light dot device of claim 8 further comprising,
a lens system for focusing the light generated by each of said linear rows of electroluminous devices into an unbroken solid line at a point of observation.

10. The electroluminous light dot device of claim 9 wherein,
the lens system comprises a Fresnel lens.

* * * * *